United States Patent
Martinez-Vargas et al.

(10) Patent No.: US 8,319,116 B2
(45) Date of Patent: Nov. 27, 2012

(54) RIB REINFORCEMENT OF PLATED THRU-HOLES

(75) Inventors: Jorge Eduardo Martinez-Vargas, San Francisco, CA (US); Lien-Fen (Livia) Hu, Sunnyvale, CA (US); Samuel Ming Sien Lee, San Jose, CA (US); James David Britton, El Paso, TX (US); Martin John Henson, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 407 days.

(21) Appl. No.: 12/557,630

(22) Filed: Sep. 11, 2009

(65) Prior Publication Data

US 2011/0061233 A1    Mar. 17, 2011

(51) Int. Cl.
*H05K 1/11* (2006.01)
(52) U.S. Cl. .................. 174/262; 174/260; 174/267
(58) Field of Classification Search .......... 174/262–266, 174/260, 267; 361/792–795
See application file for complete search history.

(56) References Cited

U.S. PATENT DOCUMENTS 7,544,899 B2 * 6/2009 Kamada et al. .............. 174/260

* cited by examiner

*Primary Examiner* — Jeremy Norris
(74) *Attorney, Agent, or Firm* — Marsh Fischmann & Breyfogle LLP; Bobby Soltani; Patrick Boucher

(57) ABSTRACT

Systems and methods for providing mechanically reinforced plated through-holes (PTH) in PCBs, which advantageously allow improved soldering capabilities and reliability, are described herein. Such systems and methods are achieved by reducing the heat sinking effects of PTHs by providing one or more vias surrounding the PTHs to provide an electrical connection between the PTH and the internal and bottom conductive layers of a PCB. In this regard, the PTHs are spaced apart from at least one of the internal conductive layers (e.g., ground or power layers), so the heat sinking effects are reduced. This feature enables molten solder to substantially fill the entire PTH before freezing, thereby improving the mechanical and electrical connection between an electrical component and the PCB. One or more electrically-nonfunctional lands (or "rib reinforcements") are provided in internal conductive layers to mechanically support the walls of the PCB. These rib reinforcements improve the mechanical strength of the PTHs without affecting the electrical performance and without impacting the ability to solder components to the PCB.

20 Claims, 9 Drawing Sheets

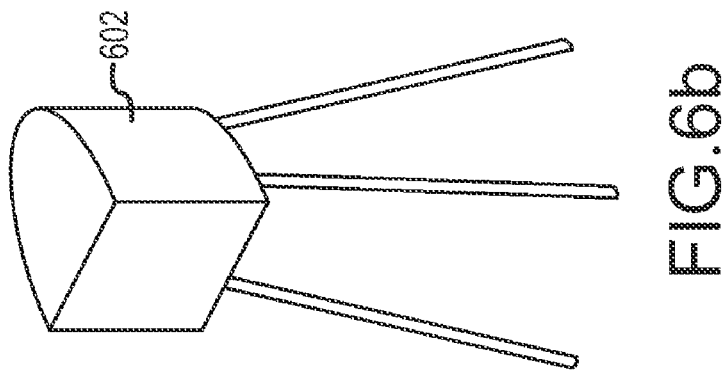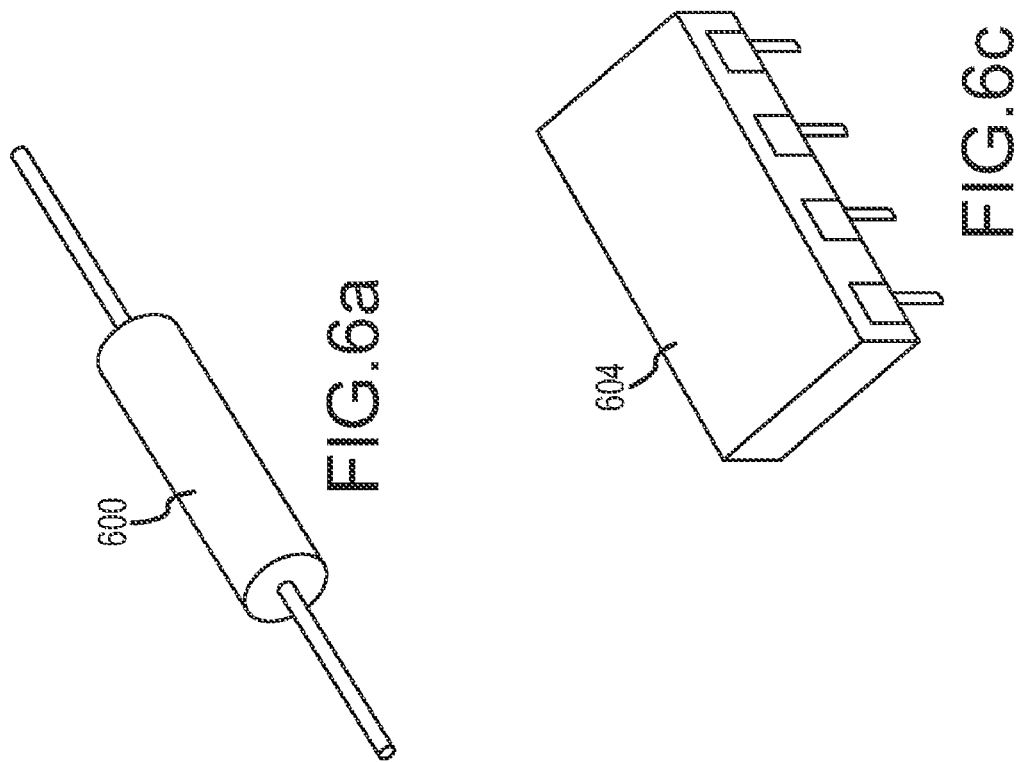

RIB REINFORCEMENT OF PLATED THRU-HOLES

BACKGROUND OF THE INVENTION

Printed circuit boards, or PCBs, are generally used to mechanically support and electrically connect electronic components using conductive pathways, or traces etched from copper sheets laminated onto a non-conductive substrate. A PCB populated with electronic components is referred to as a printed circuit assembly (PCA), also known as a printed circuit board assembly (PCBA). PCBs are generally rugged, inexpensive, and can be highly reliable. They require much more layout effort and higher initial cost than either wire-wrapped or point-to-point constructed circuits, but are much cheaper and faster for high-volume production. Some PCBs have trace layers inside the PCB and are called multi-layer PCBs, and may be formed by bonding together separately etched thin boards. Some multi-layer PCBs may include several layers (e.g., 4 layers, 12 layers, 24 layers, or more).

Holes are typically drilled through a PCB with tiny drill bits (e.g., made of solid tungsten carbide) and/or LASERS in order to connect components to different layers of the PCB. The drilling may be performed by automated drilling machines, with the placement of the holes controlled by a drill tape or a computer generated drill file. The drill file describes the location and size of each hole to be drilled in the PCB. These holes are generally referred to as "vias." These vias are often plated with conductive material (e.g., copper or aluminum) forming annular rings, which allow the electrical and thermal connection of conductors on opposite sides of a PCB.

It is also possible with controlled-depth drilling, laser drilling, or by pre-drilling the individual sheets of the PCB before lamination, to produce holes that connect only some of the copper layers, rather than passing through the entire board. These holes are called "blind vias" when they connect an internal copper layer to an outer layer, or "buried vias" when they connect two or more internal copper layers and no outer layers. The walls of the vias, for boards with 2 or more layers, are generally plated with copper to form plated-through-holes (PTH) that electrically connect the conducting layers of the PCB.

After the printed circuit board (PCB) is completed, electronic components must be attached to the PCB to form a functional PCBA. In through-hole construction, electronic component leads are inserted in PTHs in the PCB. In surface-mount technology (SMT) construction, the components are placed on pads or lands on the outer surfaces of the PCB. In both kinds of construction, component leads are electrically and mechanically fixed to the PCB with molten metal solder.

Through-hole technology, also spelled "thru-hole", refers to the mounting scheme used for pin-through-hole electronic components that involves the use of pins on the components that are inserted into copper PTH drilled in printed circuit boards (PCB) and soldered to pads on the opposite side. From the second generation of computers in the 1950s until surface-mount technology became popular in the late 1980s, every component on a typical PCB was a through-hole component. While through-hole mounting provides strong electrical and mechanical bonds when compared to surface-mount technology techniques, the additional drilling required makes the boards more expensive to produce. They also limit the available routing area for signal traces on layers immediately below the top layer on multilayer boards since the holes must pass through all layers to the opposite side. To that end, through-hole mounting techniques are now usually reserved for bulkier components such as electrolytic capacitors, power supplies, or semiconductors in larger packages that require the additional mounting strength provided by PTH technology.

PTH electronic components may be attached to a PCB using a soldering technique referred to as wave soldering. Wave soldering is a large-scale soldering process by which electronic components are soldered to a printed circuit board (PCB) to form an electronic assembly. The name is derived from the use of waves of molten solder to attach metal components to the PCB. The process uses a tank to hold a quantity of molten solder, and the components are inserted into or placed on the PCB and the loaded PCB is passed across a pumped wave or fountain of solder. The solder "wets" the exposed metallic areas of the board (e.g., those not protected with solder mask, a protective coating that prevents the solder from bridging between connections), creating a reliable mechanical and electrical connection. The process is much faster and can create a higher quality product than manual soldering of components. Wave soldering is used for both through-hole printed circuit assemblies and surface mount assemblies.

While there are many types of wave solder machines, the basic components and principles of these machines are generally the same. A standard wave solder machine includes three zones: the fluxing zone, the preheating zone, and the soldering zone. An additional fourth zone, a cleaning zone, may also be used depending on the type of flux applied.

When a PCB enters the fluxing zone, a fluxer applies flux to the underside of the board. Two types of fluxers are used: a spray fluxer and a foam fluxer. For either flux application method, precise control of flux quantities is required. Too little flux will cause poor joints, while too much flux may cause cosmetic or other problems. Also, as can be appreciated, the types of flux may affect the end result.

The PCB will then enter the preheating zone. The preheating zone consists of convection heaters, which blow hot air onto the PCB to increase its temperature. Generally, preheating is necessary to activate the flux, and to remove any flux carrier solvents. Preheating is also necessary to prevent thermal shock, which may occur when a PCB is suddenly exposed to the high temperature of the molten solder wave.

The tank of molten solder has a pattern of standing waves (or, in some cases, intermittent waves) on its surface. When the PCB is moved over this tank, the solder waves contact the bottom of the board, and stick to the solder pads and component leads by surface tension. For the pins of PTH components, molten solder fills the holes around the pins by capillary action. Precise control of wave height is required to ensure solder is applied to all areas but does not splash to the top of the board or other undesired areas. This process is sometimes performed in an inert gas nitrogen ($N_2$) atmosphere to increase the quality of the joints.

As the thickness of a PCB increases (e.g., above 100 mils, 150 mils, 200 mils, or more) and the mass of copper sheets increases (e.g., above 0.5 oz, 1.0 oz, 1.5 oz, 2.0 oz, or more), it may become more difficult to successfully fill the pin holes during the soldering process. One cause of the increased difficulty is that the molten solder tends to cool ("freeze") prematurely before it has traveled from the bottom of the PCB to the top. This problem can be further exaggerated in pin holes that are used for ground and power connections. The reason for this is that a multilayered PCB may include several ground or power layers (e.g., 4 layers, 8 layers, 12 layers, or more) that include large sheets of copper. The multiple layers of copper sheets may conduct heat away from the molten solder (i.e., act as heat sinks), causing the solder to freeze prematurely and causing the pin hole to be only partially filled with solder (e.g., 75% filled, 50% filled, or less). When the pin hole is only partially filled with solder, the mechanical and electrical integrity of the solder connection may be significantly reduced or may even be ineffective. In this regard, standards have been set to require a minimum amount of solder that fills a through hole for various components. For example, the Institute for Interconnecting and Packaging Electronic Circuits (IPC) requires solder to fill at least 75% of the through hole for a signal pin and at least 50% of the through hole for a ground or power pin.

FIGS. 1 and 2 illustrate top and cross-sectional views of a PCB 100 that includes PTH components. The PCB 100 is configured with a resistor 104 and an integrated circuit 106. The PCB 100 includes a plurality of plated through-holes (e.g., PTH 108 and 110) that may be used to couple electronic components (e.g., the resistor 104 and the integrated circuit 106) from the top layer 102 of the PCB 100 to a conductor (not shown in FIG. 1) on the bottom surface of the PCB 100. The PCB 100 may also include a plurality of metal traces (e.g., a copper trace 111) that are operative to couple different components of the PCB 100 together.

FIG. 2 illustrates a cross-sectional view of a portion of the PCB 100 shown in FIG. 1 cut at the line 2-2. As shown, the PCB 100 includes a plurality of dielectric layers 102, 116, 120, 122, 126, 128, and 132. The PCB 100 also includes a plurality of conductive layers 108, 114a-c, 118, 124, 130, and 134 disposed between (or outside of) the dielectric layers (e.g., the conductive and dielectric layers alternate). In the example shown, the resistor 104 is coupled to the conductive layers 108 and 134 (e.g., ground layers or power layers) at the bottom of the PCB 100 by soldering a pin 105 of the resistor 104 to the PCB 100 using a PTH 103 partially filled with solder. Further, the resistor 104 is coupled to other internal conductive layers 114a-114c, which are the same type of layer as the layers 108 and 134 (e.g., ground layers or power layers).

As shown, to mechanically and electrically couple the resistor 104 to the PCB 100, solder 107 is used to connect the pin 105 to the PTH 103. Thus, the pin 105 is coupled via the solder 107 and the PTH 103 to the conductive layers 108, 114a-c, and 134. It is noted that the conductive layers 118, 124, and 130 do not contact the PTH 103 and are therefore not connected to the pin 105. In this regard, the layers 118, 124, and 130 may include signal layers, ground layers, or power layers that are connected to other components.

As shown, the solder 107 only partially fills the opening of the PTH 103. This may be due to the heat sinking effects caused by the ground or power layers 114a-c and 134 that are coupled to the PTH 103. That is, during the soldering process, molten solder 107 fills the opening of the PTH 108 from the bottom to the top via capillary action, losing heat in the process. If the molten solder 107 cools too rapidly, it may freeze prematurely, causing the opening in the PTH 103 to be only partially filled as shown. Since the PTH 103 is coupled to potentially large sheets of copper (e.g., the ground or power layers 114a-c) which have a high heat transfer coefficient, the heat of the molten solder 107 is dissipated rapidly through these electrical and heat conducting layers.

SUMMARY OF THE INVENTION

The present embodiments provide methods and systems for providing improved mechanical support for plated through-holes (PTH) in PCBs, which advantageously allows the PCBs to exhibit high reliability and reworkability. Such methods and systems are achieved by providing one or more electrically-nonfunctional (or unused) lands on one or more internal layers surrounding the PTHs. In this regard, the unused lands act as "anchors" to the outer walls of the PTHs, thereby reducing the likelihood that the PTHs will be damaged during assembly and/or rework processes. These "anchors" are also referred to as "ribs." Additionally, the heat sinking effects of PTHs may be reduced by providing one or more vias surrounding the PTHs to provide an electrical connection between the PTH and the bottom layer of a PCB, thereby improving the soldering capabilities of the PTHs. In this regard, the PTHs may not directly contact all of the internal ground or power layers, so the heat sinking or heat transfer effects are reduced. This feature enables molten solder to fill substantially the entire PTH before freezing. Further, one or more of the surrounding vias may be coupled to some or all of the ground or power layers without substantially increasing the heat sinking or transfer effects of the PTH. Various features and embodiments of the present invention are described in detail below.

According to a first aspect of the present invention, a multi-layer printed circuit board (PCB) is provided. The PCB includes a plurality of conductive layers with dielectric material disposed therebetween. Further, the PCB includes a plated through-hole that extends through the PCB, the plated through-hole including a conductive lining that forms a barrel. The PCB also includes a via, spaced apart from the plated through-hole, electrically coupled to one or more internal conductive layers of the plurality of conductive layers. Additionally, the plated through-hole is electrically coupled to the via, and the plated through-hole is spaced apart from at least one of the one or more internal conductive layers. The PCB further includes an electrically-nonfunctional land formed in one of the plurality of conductive layers. In addition, the electrically-nonfunctional land is in contact with an outer wall of the barrel of the plated through-hole. In this manner, the electrically-nonfunctional land provides improved mechanical support the plated through-hole (PTH), which advantageously allows the PCB to exhibit high reliability and reworkability.

According to a second aspect of the present invention, a method of manufacturing a PCB is provided. The method includes providing a multi-layer PCB that includes a plurality of conductive layers with dielectric material disposed therebetween, at least one of the plurality of conductive layers including an electrically-nonfunctional land. The method also includes generating a plated through-hole that extends through the PCB, the plated through-hole including a conductive lining that forms a barrel positioned at a location such that an outer wall of the barrel is in contact with the electrically-nonfunctional land. The method further includes generating a via, spaced apart from the plated through-hole, that is electrically coupled to one or more internal conductive layers of the plurality of conductive layers. Further, the plated through-hole is electrically coupled to the via, and the plated through-hole is spaced apart from at least one of the one or more internal conductive layers.

According to a third aspect of the present invention, a method for mechanically coupling an electrical component to a multi-layer PCB is provided. The method includes providing a multi-layer PCB that includes a plurality of conductive layers with dielectric material disposed therebetween, a plated through-hole that extends through the PCB and includes a conductive lining that forms a barrel, and a via, spaced apart from the through-hole, electrically coupled to one or more internal conductive layers of the plurality of conductive layers. The plated through-hole of the PCB is electrically coupled to the via of the PCB, and the through-hole is spaced apart from at least one of the one or more internal conductive layers. The PCB further includes an electrically-nonfunctional land formed in one of the plurality of conductive layers that is in contact with an outer wall of the barrel. The method further includes providing an electrical component that includes a pin, and positioning the pin of the electrical component into the through-hole of the PCB. Additionally, the method includes soldering the pin to the plated through-hole to form a secure mechanical and electrical connection, wherein the solder substantially fills the through-hole.

Various features and refinements to the above-noted embodiments are also provided. For example, the one or more internal layers may include ground layers, power layers, or signal layers. In addition, the size and shape of the electrically-nonfunctional lands may be varied.

In addition to the exemplary aspects and embodiments described above, further aspects and embodiments will become apparent by reference to the drawings and by study of the following descriptions.

BRIEF DESCRIPTION OF THE DRAWINGS

FIGS. 6a-6c illustrate various electronic components that include pins that may be coupled to a PCB using a "ring of power" via of the present invention.

DETAILED DESCRIPTION

The present embodiments provide methods and systems for providing improved mechanical support for plated through-holes (PTH) in PCBs, which advantageously allows the PCBs to exhibit high reliability and reworkability. Such methods and systems are achieved by providing one or more electrically-nonfunctional (or unused) lands on one or more internal layers surrounding the PTHs. In this regard, the unused lands act as "anchors" to the outer walls of the PTHs, thereby reducing the likelihood that the PTHs will be damaged during assembly and/or rework processes. Additionally, the heat sinking effects of PTHs may be reduced by providing one or more vias surrounding the PTHs to provide an electrical connection between the PTH and the bottom layer of a PCB, thereby improving the soldering capabilities of the PTHs. In this regard, the PTHs may not directly contact all of the internal ground or power layers, so the heat sinking or heat transfer effects are reduced. This feature enables molten solder to fill substantially the entire PTH before freezing. Further, one or more of the surrounding vias may be coupled to some or all of the ground or power layers without substantially increasing the heat sinking or transfer effects of the PTH.

In the following discussion, systems and methods for providing mechanically reinforced plated through-holes for multi-layer PCBs are explored. First, with reference to FIGS. 3-7, a description of exemplary PTH assemblies with which the mechanical reinforcements may be used is provided. Next, with reference to FIGS. 8-9, particular embodiments of anchored or rib reinforcements for plated through-holes are shown and described.

Figure 1:
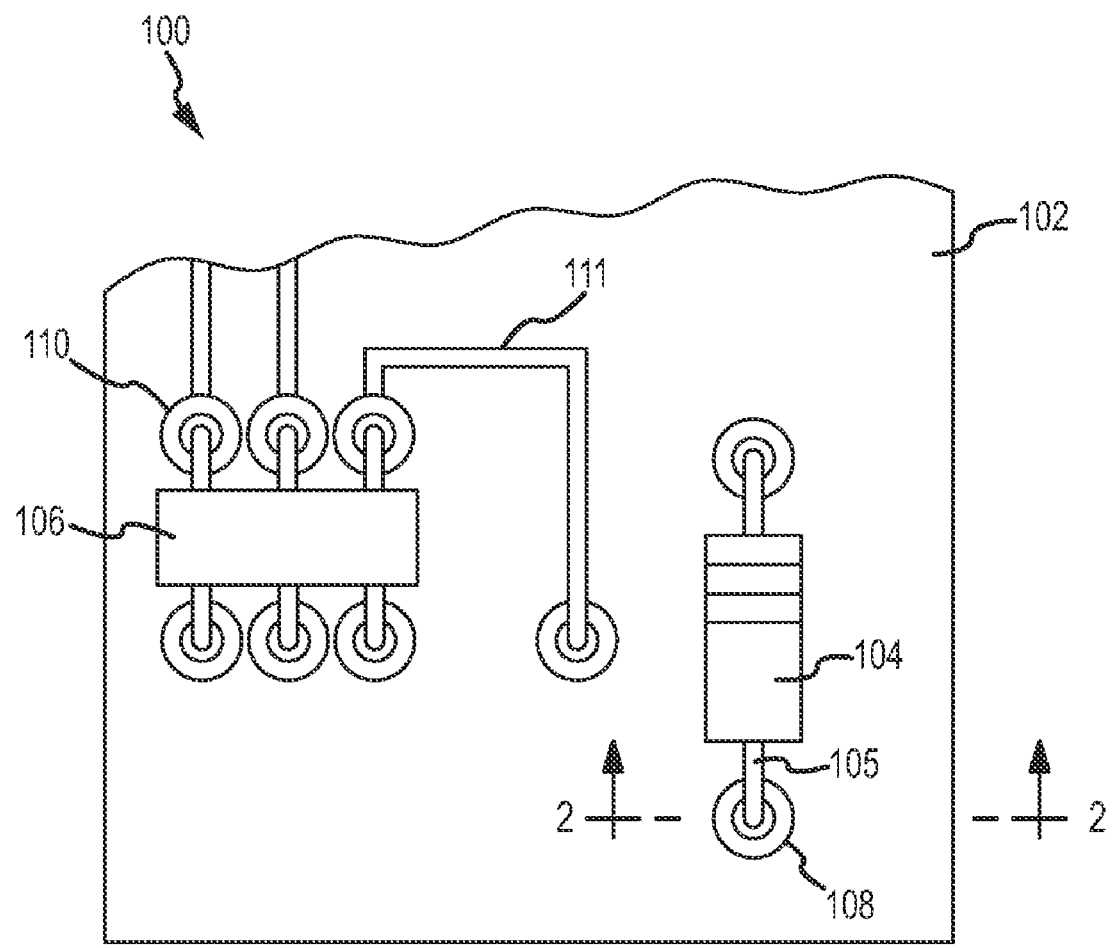
FIG. 1 illustrates a prior art PCB configured with various electronic components.
Figure 2:
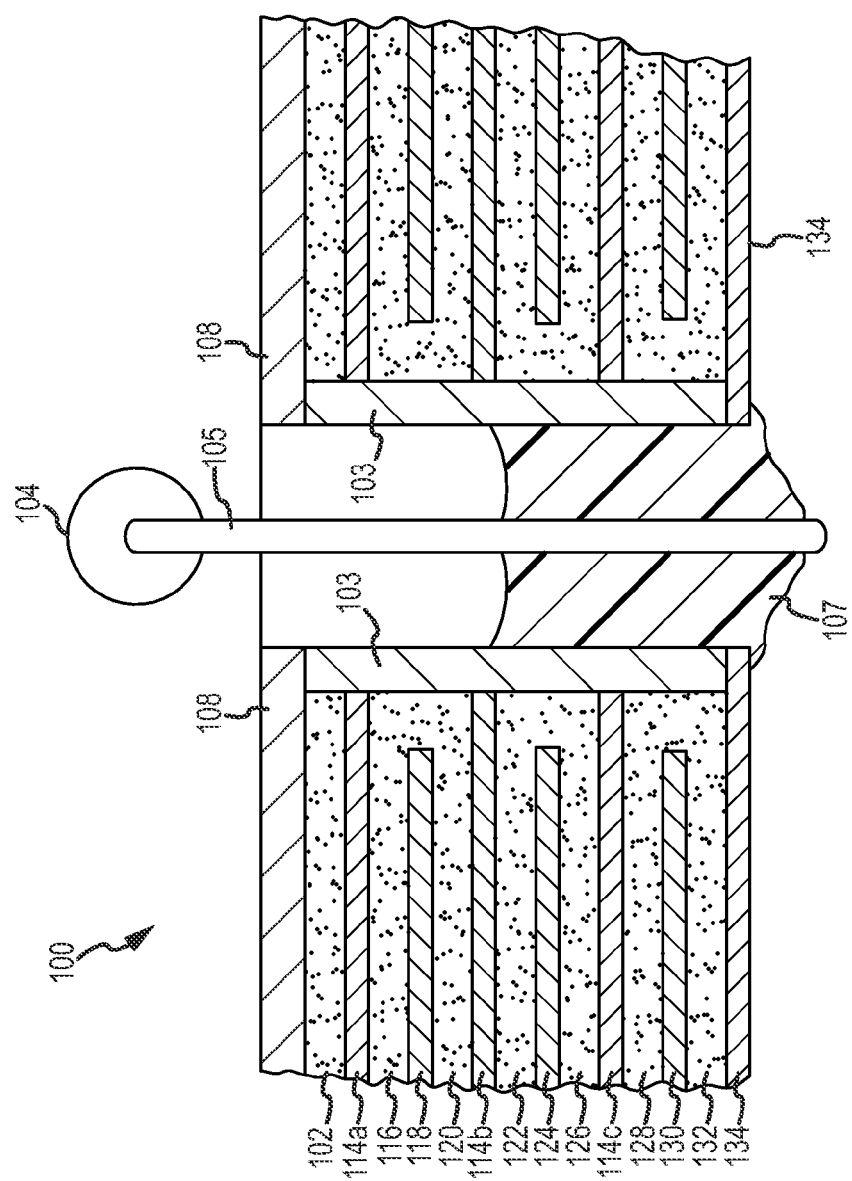
FIG. 2 illustrates the solder connection between a plated through-hole of a PCB and a resistor.
Figure 3B:
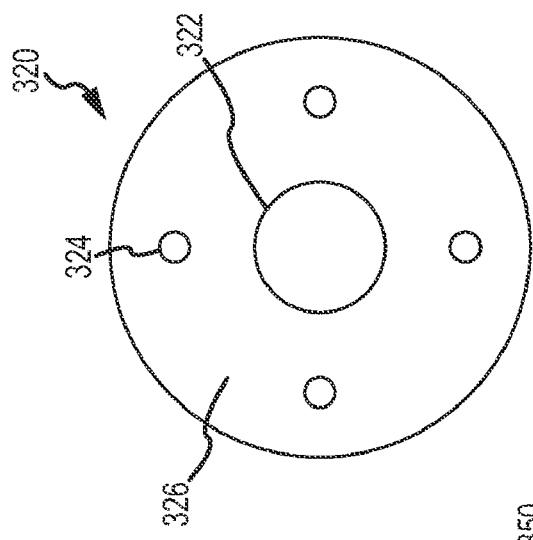
FIGS. 3a-3c illustrate various embodiments of an exemplary "ring of power" via of the present invention.
Figure 3C:
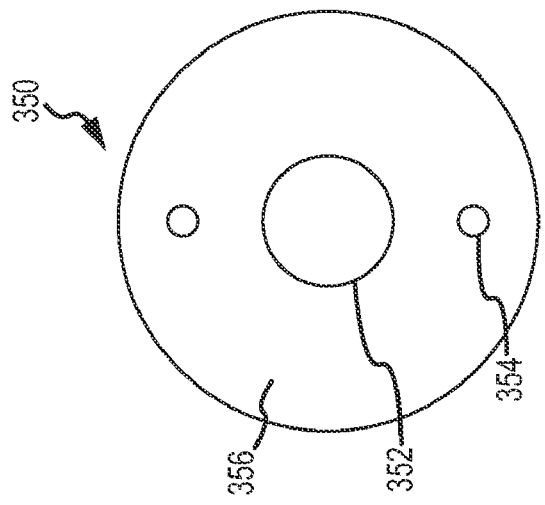
Figure 3A:
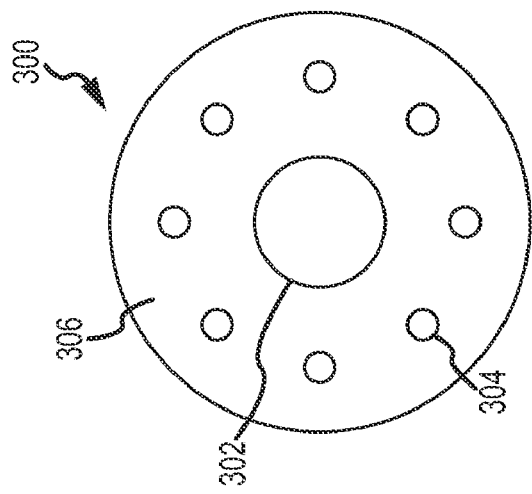

FIGS. 3a-3c illustrate top views of various embodiments of exemplary "ring of power" vias (or PTH assemblies) 300, 320, and 350 of the present invention. FIG. 3a illustrates a PTH 302 that is surrounded by eight plated vias 304. The PTH 302 is electrically coupled to the vias 304 by a conductive layer 306 that may be disposed, for example, over the top layer of a PCB. For example, the conductive layer 306 may be metallic pad (e.g., a surface land) printed on the surface of a PCB and coupled to the PTH 302. The PTH 302 may be used to couple a pin of an electronic device (e.g., a resistor, a transistor, an integrated circuit, or the like) on the top layer of a PCB to an electrical connection on the bottom layer of the PCB. Advantageously, the PTH 302 is not connected to any internal layers on the PCB, but rather, the eight vias 304 are utilized to couple the PTH 302 to the bottom conductive layer of a PCB through the conductive layer 306 (see FIGS. 4 and 5 and related description). In this regard, a relatively low amount of heat is transferred away from the PTH 302 when molten solder fills it during the soldering process, thereby allowing the molten solder to substantially fill the PTH 302 without prematurely freezing.

FIG. 3b illustrates another "ring of power" via 320 which includes a PTH 322 which is surrounded by four vias 324. The vias 324 and the PTH 322 are coupled together through a conductive layer 326. Similarly, another "ring of power" via 350 is shown in FIG. 3c that includes a PTH 352, two vias 354, and a conductive layer 356.

It should be appreciated that the embodiments shown in FIGS. 3a-3c are mere examples, and that other numbers of vias may be provided. Further, the size and shape of the PTHs and the vias may be configured to suit a particular application. For example, in applications which require a relatively large amount of current flow, the relative number of vias surrounding a PTH may be increased to account for this factor. Other relevant factors may include PCB thickness, the number of layers that are to be coupled to the vias, thickness of the copper plating for the PTH and/or the vias, or any other factors. As an example, in one embodiment, a PTH has a hole diameter of about 80 to 100 mils, while the surrounding vias have a hole diameter of about 15 to 25 mils. As can be appreciated, any suitable hole diameter for the PTH and vias may be used to suit a particular application.

Figure 4:
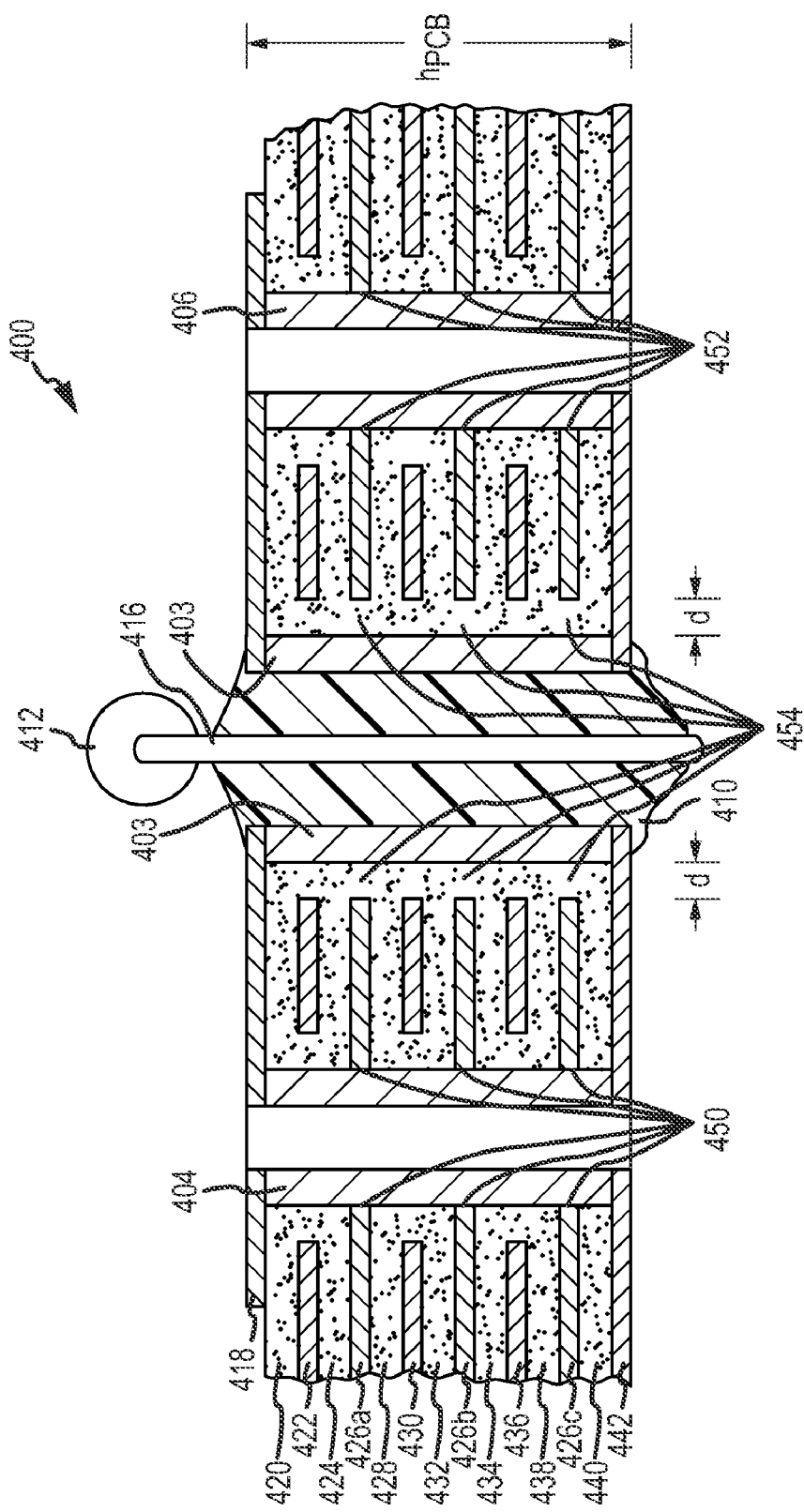
FIG. 4 illustrates a cross-sectional view of an exemplary "ring of power" via of the present invention.
Figure 5:
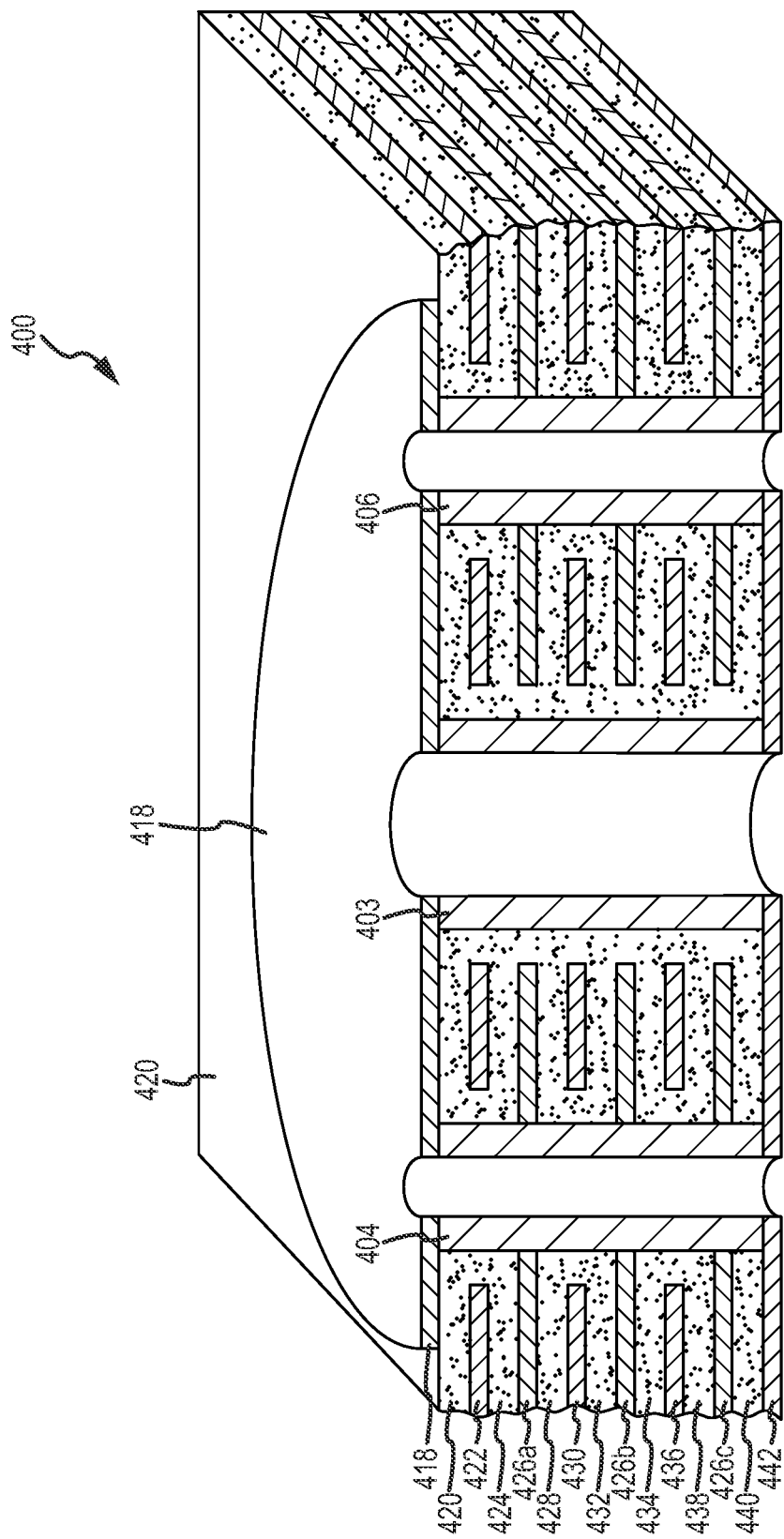
FIG. 5 illustrates a perspective cross-sectional view of an exemplary "ring of power" via of the present invention.

FIGS. 4 and 5 illustrate two cross-sectional views of an exemplary PCB 400 that includes a "ring of power" via. As shown the "ring of power" via includes a PTH 403, two vias 404 and 406 (similar to the "ring of power" via 350 shown in FIG. 3c), and a conductive surface land 418. The PCB 400 includes signal layers 422, 430, and 436, ground layers 426a-c and 442, and dielectric layers 420, 424, 428, 432, 434, 438, and 440 disposed between the various conductive layers. Typically, the conductive layers are made of copper, but other conductive material may be used. Further, the dielectric layers may be made of epoxy resin (e.g., FR4), polyimide, polytetrafluoroethylene (PTFE), or any other suitable dielectric material.

In the example shown in FIG. 4, a pin 416 of a resistor 412 is to be coupled to ground potential. To achieve this, the PTH 403 is coupled to the vias 404 and 406 through the surface land 418, and the vias 404 and 406 are in turn coupled to the internal ground layers 426a-c (e.g., at the points 450 for the via 404 and at the points 452 for the via 406). That is, the PTH 403 is not directly coupled to the internal ground layers 426a-c (as shown by the spaces 454, which show that the ground layers 426a-c are spaced apart from a sidewall of the PTH 403 by a distance "d"), but only indirectly through the plated vias 404 and 406 by way of the surface land 418. As noted above, often the ground (or power) layers may be large, continuous sheets of copper. Thus, to ensure that the internal ground layers 426a-c do not contact the PTH 403, the copper sheets may include patterned holes having a diameter that is greater than the outer diameter of the PTH 403. These patterned holes may generally be referred to as clearance holes, or anti-pads.

By not directly coupling the PTH 403 to the internal ground layers, the PTH 403 has relatively low heat transfer characteristics. This feature permits molten solder 410 to "wick" up through the PTH 403 to substantially fill the entire PTH 403 during the soldering process. As a result, the electrical and mechanical connections between the pin 416 and the associated PCB are relative secure.

It should be appreciated that although the embodiment shown in FIGS. 4 and 5 show the PTH 403 as not being connected to any of the internal ground layers 426a-c, other PTHs may be provided to connect pins to power layers or signal layers. As noted above, typical multilayered PCBs may have multiple ground and power layers (e.g., 4 layers, 8 layers, 12 layers, or more) that are essentially copper sheets that may conduct a relatively large amount of heat. Therefore, the "ring of power" vias described herein may more helpful when used with power and/or ground connections. Further, as the height of a PCB ($h_{PCB}$) increases (e.g., over 50 mils, over 100 mils, or more), the features of the present invention may be increasingly beneficial.

FIGS. 6a-6c illustrate various electronic components that include pins that may be coupled to a PCB using PTH technology. More specifically, FIG. 6a shows a resistor 600; FIG. 6b shows a transistor 602; and FIG. 6c shows an integrated circuit 604. As can be appreciated, various other electronic components may also be used in a PCBA that incorporates the "ring of power" vias described herein.

Figure 7:
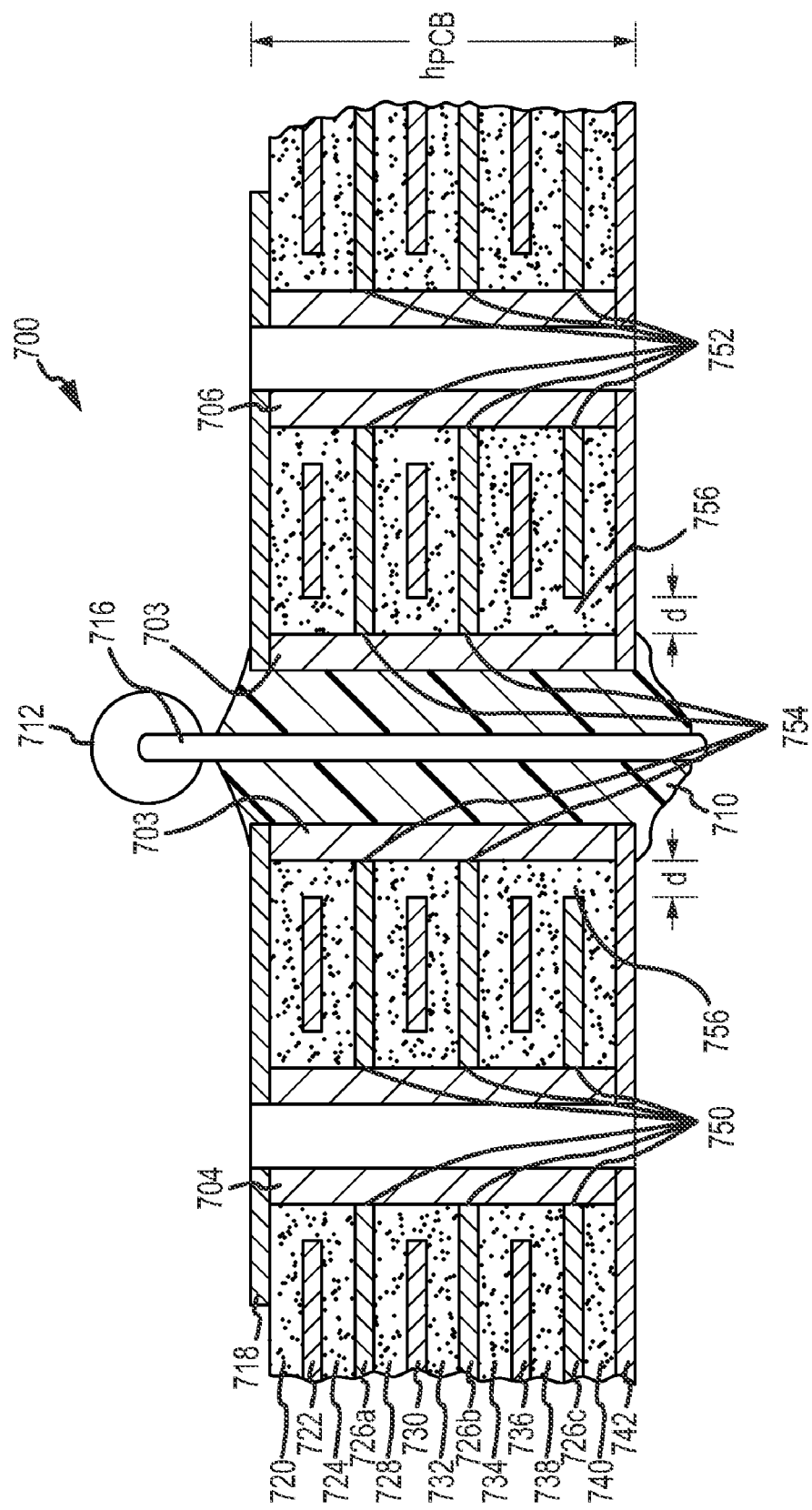
FIG. 7 illustrates a cross-sectional view of another exemplary "ring of power" via of the present invention.

FIG. 7 illustrates a cross-sectional view of an exemplary PCB 700 that includes a "ring of power" via. As shown the "ring of power" via includes a PTH 703, two vias 704 and 706 (similar to the "ring of power" via 350 shown in FIG. 3c), and a conductive surface lands 718 and 742. The PCB 700 includes signal layers 722, 730, and 736, ground layers 726a-c and 742, and dielectric layers 720, 724, 728, 732, 734, 738, and 740 disposed between the various conductive layers.

In the example shown in FIG. 7, a pin 716 of a resistor 712 is to be coupled to ground potential. To achieve this, the PTH 703 is coupled to the vias 704 and 706 through the surface lands 718 and 742 and the ground layers 726a-b (as shown by the points 754 at the intersection of a sidewall of the PTH 703 and the ground layers 726a-b), and the vias 704 and 706 are in turn coupled to the internal ground layers 726a-c (e.g., at the points 750 for the via 704 and at the points 752 for the via 706). That is, the PTH 703 is not directly coupled to the internal ground layer 726c (as shown by the spaces 756 having a width "d"), but only indirectly through the plated vias 704 and 706 by way of the surface lands 718 and 742, and the ground layers 726a-b. As noted above, often the ground (or power) layers may be large, continuous sheets of copper.

Thus, to ensure that the internal ground layer 726c does not contact the PTH 703, the copper sheets may include patterned holes having a diameter that is greater than the outer diameter of the PTH 703, such that the ground layer 726c is spaced apart from the sidewall of the PTH 703 by a distance "d". These patterned holes may generally be referred to as clearance holes, or anti-pads.

By not directly coupling the PTH 703 to the internal ground layer 726c, the PTH 703 has relatively lower heat transfer characteristics. This feature permits molten solder 710 to "wick" up through the PTH 703 to substantially fill the entire PTH 703 during the soldering process. As a result, the electrical and mechanical connections between the pin 716 and the associated PCB are relative secure.

It should be appreciated that although the embodiment shown in FIG. 7 show the PTH 703 as not being connected to the internal ground layer 726c, other configurations are contemplated. For example, any number of internal conductive layers (e.g., one layer, more than one layer, all internal layers, or the like) may be spaced apart from a PTH to reduce the heat transfer characteristics to a level that it suitable for a particular soldering process.

Figure 8:
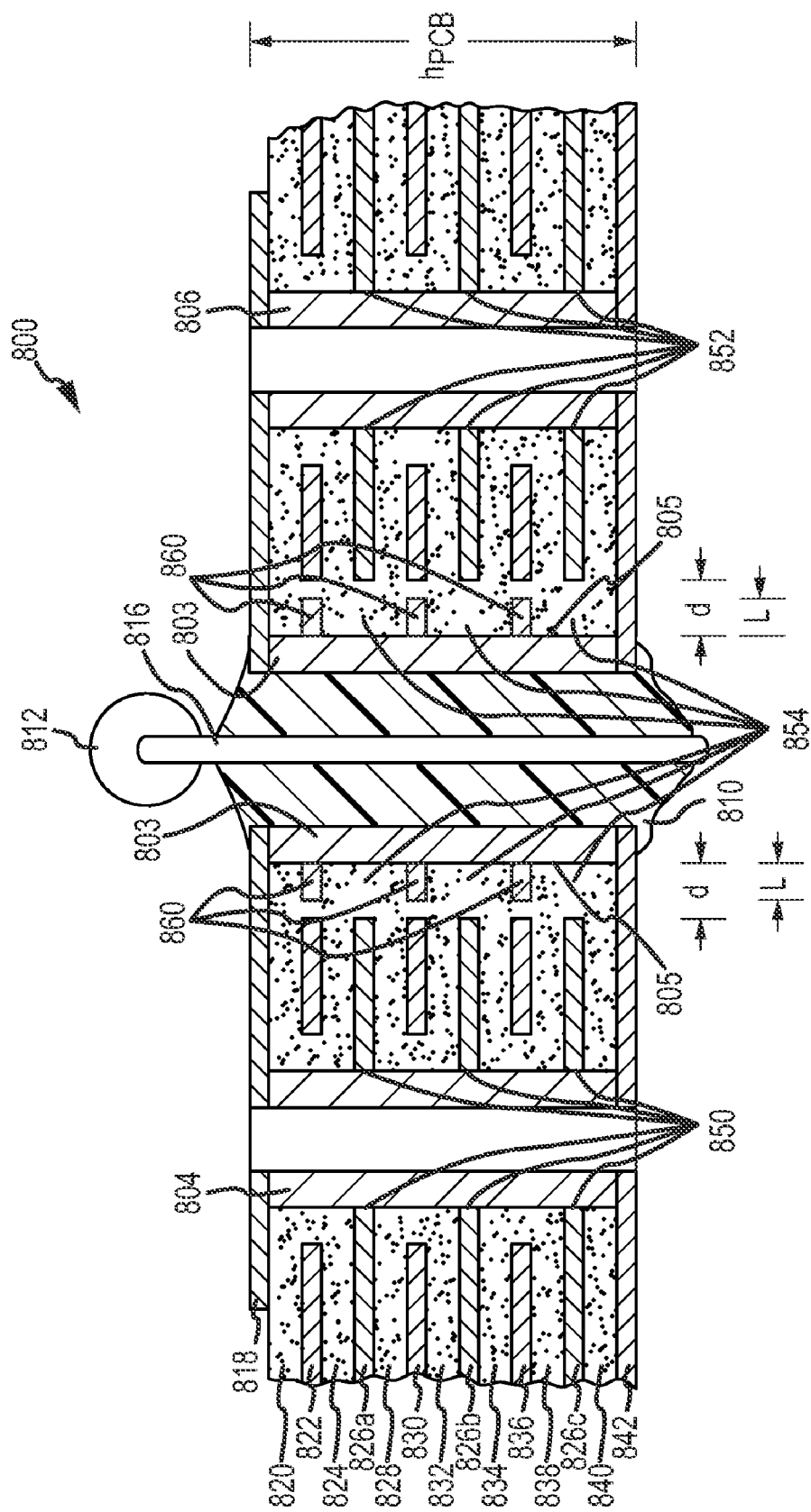
FIG. 8 illustrates a cross-sectional view of an exemplary "ring of power" via of the present invention that includes rib reinforcements.

FIG. 8 illustrates a cross-sectional view of an exemplary multi-layer PCB 800 that includes a "ring of power" via. The multi-layer PCB 800 is similar in many aspects to the multi-layer PCB 400 shown in FIGS. 4 and 5. As shown, the "ring of power" via includes a PTH 803 that is supported by electrically-nonfunctional (or "unused) lands 860, two vias 804 and 806, and a conductive surface lands 818 and 842. The PCB 800 includes signal layers 822, 830, and 836, ground layers 826a-c and 842, and dielectric layers 820, 824, 828, 832, 834, 838, and 840 disposed between the various conductive layers. In this example, the unused lands (or "ribs") 860 are formed in the signal (or trace) layers 822, 830, and 836, but in other embodiments the unused lands 860 may be formed in one or more other internal layers. The unused lands 860 may extend around the circumference of the outer wall 805 of the PTH 803 by a distance "L" (e.g., 2 mils, 4 mils, 10 mils, or the like). Typically, the conductive layers are made of copper, but other conductive material may be used. Further, the dielectric layers may be made of epoxy resin (e.g., FR4), polyimide, polytetrafluoroethylene (PTFE), or any other suitable dielectric material.

In the example shown in FIG. 8, a pin 816 of a resistor 812 is to be coupled to ground potential. To achieve this, the PTH 803 is coupled to the vias 804 and 806 through the surface lands 818 and 842, and the vias 804 and 806 are in turn coupled to the internal ground layers 826a-c (e.g., at the points 850 for the via 804 and at the points 852 for the via 806). That is, the PTH 803 is not directly coupled to the internal ground layers 826a-c (as shown by the spaces 854, which show that the ground layers 826a-c are spaced apart from a barrel wall of the PTH 803 by a distance "d"), but only indirectly through the plated vias 804 and 806 by way of the surface lands 818 and 842. As noted above, often the ground (or power) layers may be large, continuous sheets of copper. Thus, to ensure that the internal ground layers 826a-c do not contact the PTH 803, the copper sheets may include patterned holes having a diameter that is greater than the outer diameter of the PTH 803. These patterned holes may generally be referred to as clearance holes, or anti-pads.

As described above with reference to the PCB 400 shown in FIGS. 4 and 5, by not directly coupling the PTH 803 to the internal ground layers, the PTH 803 has relatively low heat transfer characteristics. This feature permits molten solder 810 to "wick" up through the PTH 803 to substantially fill the entire PTH 803 during the soldering process. As a result, the electrical and mechanical connections between the pin 816 and the associated PCB are relative secure.

As the height of the PCB 800 ($h_{PCB}$) increases (e.g., over 50 mils, over 100 mils, or more), it may be desirable to provide additional mechanical support for the PTH 803. For instance, if the PTH 803 is not adequately supported, the PTH 803 may separate from the dielectric layers (e.g., layers 820, 824, 828, and the like) during assembly or rework processes. As a further example, the PTH 803 may be completely removed from the PCB 800 during rework due to the mechanical forces exerted on the PTH 803 (e.g., physically or thermally exerted mechanical forces).

To improve the mechanical strength of the PTH 803 without affecting the electrical performance and without impacting the ability to solder components to the PCB 800, unused lands ("ribs") 860 are provided. Generally, the unused lands 860 (or "ribs") act as anchors or mechanical supports to the outer barrel wall 805 of the PTH 803. As can be appreciated, the unused lands 860 may provide the plated surface of the PTH 803 with a structure to "grab" onto to avoid separation and ripping of the PTH 803 as the PCB 800 is put through an assembly and/or rework process.

Figure 9:
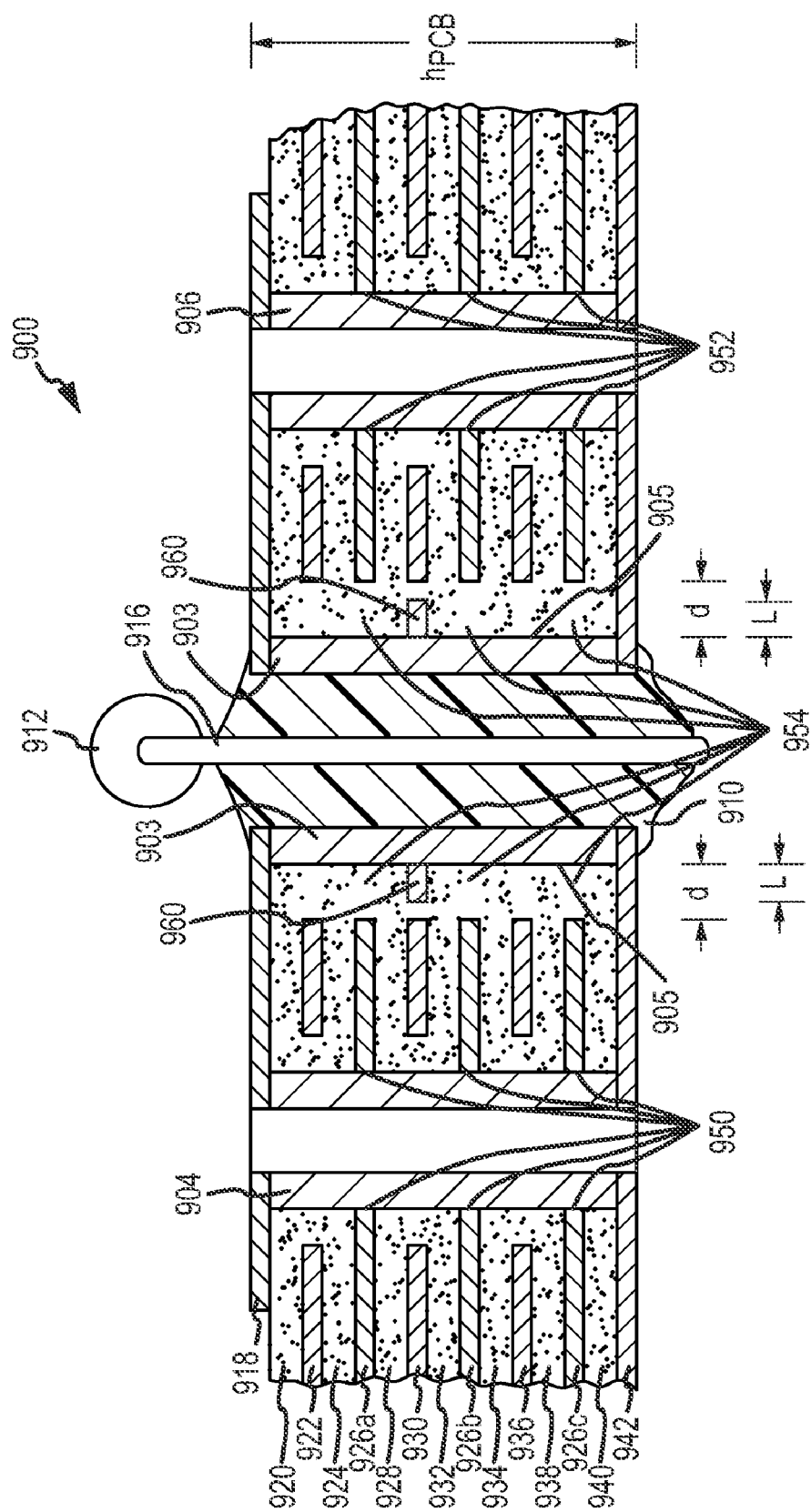
FIG. 9 illustrates another cross-sectional view of an exemplary "ring of power" via of the present invention that includes rib reinforcements.

FIG. 9 illustrates a cross-sectional view of an exemplary multi-layer PCB 900 that includes a "ring of power" via. Since the multi-layer PCB 900 is substantially similar to the multi-layer PCB 800 shown in FIG. 8, only differences in the PCB 900 from the PCB 800 will be described. Further, the components of the PCB 900 that correspond to the components of the PCB 800 are referenced with similar reference numerals. For example, the conductive layers of the PCB 900 have the reference numeral 926*a-c*, whereas the conductive layers of the PCB 800 have the reference numeral 826*a-c*.

As shown, the PTH 903 of the PCB 900 includes a single "rib" or unused land 960 formed in the conductive signal layer 930. In this embodiment, it may be desirable to include unused lands on less than all of the signal layers 922, 930, 936 for a variety of reasons, including reduced manufacturing complexity, reduced cost, or the like. Further, as can be appreciated, one or more unused lands 960 may be provided on any of the internal conductive layers in any suitable combination. The unused lands 960 may be symmetrically positioned across the height ($h_{PCB}$) of the PCB 900, or the unused lands 960 may be provided asymmetrically (e.g., more lands at the top or bottom of the PCB 900). It should be readily recognized that the number and size of the unused lands 960 for a PCB 900 may vary depending on factors such as material used, application, PCB height, and the like. Additionally, the shape of the unused lands may be of any suitable shape (e.g., circular, square, or other shape).

It will be appreciated that the features of the embodiments presented herein may provide several advantages. For example, by providing "rib" reinforcement of the plated through-holes, scrap costs associated with the rework of PTH components may be substantially reduced. Further, the features described herein may provide some relief to PTH solder joints that would normally tend to exhibit separation of the plating of the PTH, which may reduce the reliability of the associated PCB. Further, the rib reinforcements may improve the strength of the PTHs without affecting the electrical performance and without impacting the ability to solder components to a PCB. Those skilled in the art will recognize other features and advantages that may be provided by the embodiments described herein.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

We claim:

1. A multi-layer printed circuit board (PCB) comprising:
   a plurality of conductive layers with dielectric material disposed therebetween, wherein the plurality of conductive layers include a plurality of signal layers and a plurality of ground layers;
   a plated through-hole that extends through the PCB, the plated-through hole including a conductive lining that forms a barrel;
   a via, spaced apart from the plated through-hole, electrically coupled to and in contact with each of the plurality of ground layers, wherein the plated through-hole is electrically coupled to the via, and wherein the plated through-hole is spaced apart from each of the plurality of ground layers; and
   an electrically-nonfunctional land formed in one of the plurality of conductive layers, the electrically-nonfunctional land being in contact with an outer wall of the barrel of the plated through-hole.

2. The multi-layer PCB of claim 1, wherein the one of the plurality of conductive layers in which the electrically-nonfunctional land is formed comprises one of the plurality of signal layers.

3. The multi-layer PCB of claim 1, further comprising:
   a plurality of electrically-nonfunctional lands each formed in one of the plurality of conductive layers, wherein each of the electrically-nonfunctional lands are in contact with the outer wall of the barrel of the plated through-hole.

4. The multi-layer PCB 1 of claim 1, wherein the electrically-nonfunctional land is substantially circular in shape.

5. The multi-layer PCB of claim 1, wherein the plated through-hole is plated with copper.

6. The multi-layer PCB of claim 1, wherein the multi-layer PCB has a thickness of greater than 90 mils.

7. The multi-layer PCB of claim 1, wherein the via is a first via, the multi-layer PCB further comprising:
   a second via, spaced apart from the plated through-hole, electrically coupled to and in contact with the each of the plurality of ground layers, wherein the plated through-hole is electrically coupled to the second via.

8. A method of manufacturing a PCB, the method comprising:
   providing a multi-layer PCB that includes a plurality of conductive layers with dielectric material disposed therebetween, wherein the plurality of conductive layers include a plurality of signal layers and a plurality of ground layers;
   generating a plated through-hole that extends through the PCB, the plated through-hole including a conductive lining that forms a barrel positioned at a location such that an outer wall of the barrel is in contact with an electrically-nonfunctional land formed in one of the plurality of conductive layers; and
   generating a via, spaced apart from the plated through-hole, that is electrically coupled to and in contact with each of the plurality of ground layers, wherein the plated through-hole is electrically coupled to the via, and wherein the plated through-hole is spaced apart from each of the plurality of ground layers.

9. The method of claim 8, wherein the one of the plurality of conductive layers in which the electrically-nonfunctional land is formed comprises one of the plurality of signal layers.

10. The method of claim 8, wherein the multi-layer PCB comprises a plurality of electrically-nonfunctional lands each formed in one of the plurality of conductive layers, wherein each of the electrically-nonfunctional lands are in contact with the outer wall of the barrel.

11. The method of claim 8, wherein the generating the plated through-hole includes drilling a hole through the multi-layer PCB.

12. The method of claim 8, wherein the electrically-nonfunctional land is substantially circular in shape.

13. The method of claim 8, wherein the one or more internal conductive layers includes at least two layers, and wherein the through-hole is spaced apart from at least two of the internal conductive layers.

14. The method of claim 8, wherein the via is a first via, the method further comprising:
    generating a second via, spaced apart from the through-hole, that is electrically coupled to the and in contact with each of the plurality of ground layers, wherein the through-hole is electrically coupled to the second via.

15. A method for mechanically coupling an electrical component to a multi-layer PCB, the method comprising:
    providing a multi-layer PCB that includes:
        a plurality of conductive layers with dielectric material disposed therebetween wherein the plurality of conductive layers include a plurality of signal layers and a plurality of ground layers;
        a plated through-hole that extends through the PCB, the plated-through hole including a conductive lining that forms a barrel;
        a via, spaced apart from the plated through-hole, electrically coupled to and in contact with each of the plurality of ground layers, wherein the plated through-hole is electrically coupled to the via, and wherein the plated through-hole is spaced apart from each of the plurality of ground layers; and
        an electrically-nonfunctional land formed in one of the plurality of conductive layers that is in contact with an outer wall of the barrel;
    providing an electrical component that includes a pin;
    positioning the pin of the electrical component into the plated through-hole of the PCB; and
    soldering the pin to the through-hole to form a secure mechanical and electrical connection, wherein the solder substantially fills the through-hole.

16. The method of claim 15, wherein the soldering is performed by a wave soldering process.

17. The method of claim 15, wherein the one of the plurality of conductive layers in which the electrically-nonfunctional land is formed comprises one of the plurality of signal layers.

18. The method of claim 15, wherein the multi-layer PCB comprises a plurality of electrically-nonfunctional lands each formed in one of the plurality of conductive layers, wherein each of the electrically-nonfunctional lands are in contact with the outer wall of the barrel.

19. The method of claim 15, wherein the generating the plated through-hole includes drilling a hole through the multi-layer PCB.

20. The method of claim 15, wherein the electrically-nonfunctional land is substantially circular in shape.

\* \* \* \* \*